United States Patent
Zhou

(10) Patent No.: US 10,855,301 B2
(45) Date of Patent: Dec. 1, 2020

(54) DIGITAL TO ANALOG CONVERTER DEVICE AND CALIBRATION METHOD

(71) Applicant: Realtek Semiconductor Corporation, Hsinchu (TW)

(72) Inventor: Xiao-Bo Zhou, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/785,763

(22) Filed: Feb. 10, 2020

(65) Prior Publication Data

US 2020/0274544 A1 Aug. 27, 2020

(30) Foreign Application Priority Data

Feb. 27, 2019 (CN) .......................... 2019 1 0146771

(51) Int. Cl.
*H03M 1/10* (2006.01)
(52) U.S. Cl.
CPC ........ *H03M 1/1023* (2013.01); *H03M 1/1009* (2013.01); *H03M 1/1014* (2013.01)
(58) Field of Classification Search
CPC . H03M 1/1023; H03M 1/1014; H03M 1/1009
USPC .................................................. 341/155, 120
See application file for complete search history.

(56) References Cited

U.S. PATENT DOCUMENTS

| | | | |
|---|---|---|---|
| 9,577,657 B1 * | 2/2017 | Clara | H03M 1/109 |
| 10,547,319 B2 * | 1/2020 | Ali | H03M 1/1004 |
| 10,587,279 B1 * | 3/2020 | Yang | H03M 1/06 |
| 10,715,163 B2 * | 7/2020 | Chao | H03M 1/1033 |
| 2012/0007757 A1 | 1/2012 | Choe et al. | |

FOREIGN PATENT DOCUMENTS

TW I632778 B 8/2018

OTHER PUBLICATIONS

Wei-Hsin Tseng et al., "A 960MS/s DAC with 80dB SFDR in 20nm CMOS for Multi-Mode Baseband Wireless Transmitter", IEEE 2014 Symposium on VLSI Circuits Digest of Technical Papers, 2014.
Hans Van de Vel et al., "A 240mW 16b 3.2GS/s DAC in 65nm CMOS with <-80dBc IM3 up to 600MHz", 2014 IEEE International Solid-State Circuits Conference, 2014.

(Continued)

*Primary Examiner* — Brian K Young
(74) *Attorney, Agent, or Firm* — Locke Lord LLP; Tim Tingkang Xia, Esq.

(57) ABSTRACT

A digital-to-analog converter (DAC) device includes a DAC circuitry and a calibration circuitry. The DAC circuitry includes first and second DAC circuits which generate first and second signals according to an input pattern. The input pattern includes at least one of first logic value and at least one of second logic value that have different numbers. The calibration circuitry performs a calibration operation according to first and second comparison results, to generate a control signal for controlling the second DAC circuit. The first comparison results are comparison results of the first and the second signals when the input pattern is a first pattern, the second comparison results are comparison results of the first and the second signals when the input pattern is a second pattern, and the first pattern is inverse to the second pattern.

20 Claims, 4 Drawing Sheets

(56) References Cited

OTHER PUBLICATIONS

Yongjian Tang et al., "A 14 bit 200 MS/s DAC With SFDR >78 dBc, IM3 < -83 dBc and NSD <-163 Across the Whole Nyquist Band Enabled by Dynamic-Mismatch Mapping", IEEE Journal of Solid-State Circuits, vol. 46, No. 6, Jun. 2011, p. 1371-p. 1381.

Tao Chen et al., "A 14-bit 200-MHz Current-Steering DAC With Switching-Sequence Post-Adjustment Calibration", IEEE Journal of Solid-State Circuits, vol. 42, No. 11, Nov. 2007, p. 2386-p. 2394.

Yonghua Cong et al., "A 1.5-V 14-Bit 100-MS/s Self-Calibrated DAC", IEEE Journal of Solid-State Circuits, vol. 38, No. 12, Dec. 2003, p. 2051-p. 2060.

Douglas A. Mercer, "Low-Power Approaches to High-Speed Current-Steering Digital-to-Analog Converters in 0.18-μm CMOS", IEEE Journal of Solid-State Circuits, vol. 42, No. 8, 2007, p. 1688-p. 1698.

Alex R. Bugeja et al., "A Self-Trimming 14-b 100-MS/s CMOS DAC", IEEE Journal of Solid-State Circuits, vol. 35, No. 12, Dec. 2000, p. 1841-p. 1852.

G.I.Radulov et al., "A Self-Calibrating Current-Steering 12-Bit DAC Based on New 1-Bit Self-Test Scheme", IEEE IC Test Workshop 2004, Sep. 13-14, 2004.

Meng-Hung Shen et al., "A Low Cost Calibrated DAC for High-Resolution Video Display System", IEEE Transactions on Very Large Scale Integration (VLSI) Systems, vol. 20, No. 9, 2012, p. 1743-p. 1747.

Yusuke Ikeda et al., "A 14-bit 100-MS/s Digitally Calibrated Binary-Weighted Current-Steering CMOS DAC without Calibration ADC", IEEE Asian Solid-State Circuits Conference, Nov. 12-14, 2007.

Mika P. Tiilikainen, "A 14-bit 1.8-V 20-mW 1-mm2 CMOS DAC", IEEE Journal of Solid-State Circuits, vol. 36, No. 7, Jul. 2001, p. 1144-p. 1147.

Jen-Hung Chi et al., "A 1.8-V 12-Bit 250-MS/s 25-mW Self-calibrated DAC", IEEE 2010, p. 222-p. 225.

* cited by examiner

DIGITAL TO ANALOG CONVERTER DEVICE AND CALIBRATION METHOD

RELATED APPLICATIONS

This application claims priority to China Application Serial Number 201910146771.4, filed Feb. 27, 2019 which is herein incorporated by reference in its entirety.

BACKGROUND

Technical Field

The present disclosure relates to a digital to analog converter (DAC) device. More particularly, the present disclosure relates to a DAC device and a calibration that eliminate amplitude errors and timing errors.

Description of Related Art

Digital to analog converter (DAC) has been widely applied to various electronic devices. In practical applications, due to impacts from various variations and circuit offsets, an amplitude error and/or a timing error may occur on an output signal of the DAC. In some applications (e.g., applications where an inductive load is used), these two errors cannot be eliminated at the same time, or a calibration circuit is required to have a complex circuit architecture and higher circuit area to eliminate these two errors.

SUMMARY

Some aspects of the present disclosure are related to a digital-to-analog converter (DAC) device that includes a DAC circuitry and a calibration circuitry. The DAC circuitry includes a first DAC circuit and a second DAC circuit. The first DAC circuit and the second DAC circuit are configured to generate a first signal and a second signal according to an input pattern. The input pattern includes at least one first logic value and at least one second logic value, and a number of the at least one first logic value is different from a number of the at least one second logic value. The calibration circuitry is configured to perform a calibration operation according to multiple first comparison results and multiple second comparison results, in order to generate a control signal for controlling the second DAC circuit. The multiple first comparison results are results of comparing the first signal with the second signal when the input pattern is a first pattern. The multiple second comparison results are results of comparing the first signal with the second signal when the input pattern is a second pattern, and the first pattern is inverse to the second pattern.

Some aspects of the present disclosure are related to a calibration method, which includes the following operations: generating, by a first DAC circuit and a second DAC circuit, a first signal and a second signal according to an input pattern, in which the input pattern comprises at least one first logic value and at least one second logic value, and a number of the at least one first logic value is different from a number of the at least one second logic value; and performing a calibration operation according to multiple first comparison results and multiple second comparison results, in order to generate a control signal for controlling the second DAC circuit, in which the multiple first comparison results are results of comparing the first signal with the second signal when the input pattern is a first pattern, the multiple second comparison results are results of comparing the first signal with the second signal when the input pattern is a second pattern, and the first pattern is inverse to the second pattern.

As described above, the DAC device and the calibration method provided in embodiments of the present disclosure are able to calibrate the circuit offsets of the DAC device by using input patterns that are DC imbalanced (e.g., the number of logic values of 1 is different from the number of logic values of 0) and the averaging operation. As a result, the impacts of amplitude errors and timing errors can be reduced.

DETAILED DESCRIPTION

In this document, the term "circuitry" may indicate a system formed with one or more circuits. The term "circuit" may indicate an object, which is formed with one or more transistors and/or one or more active/passive elements based on a specific arrangement, for processing signals.

For ease of understanding, like elements in figures are designated with the same reference numbers.

Figure 1:
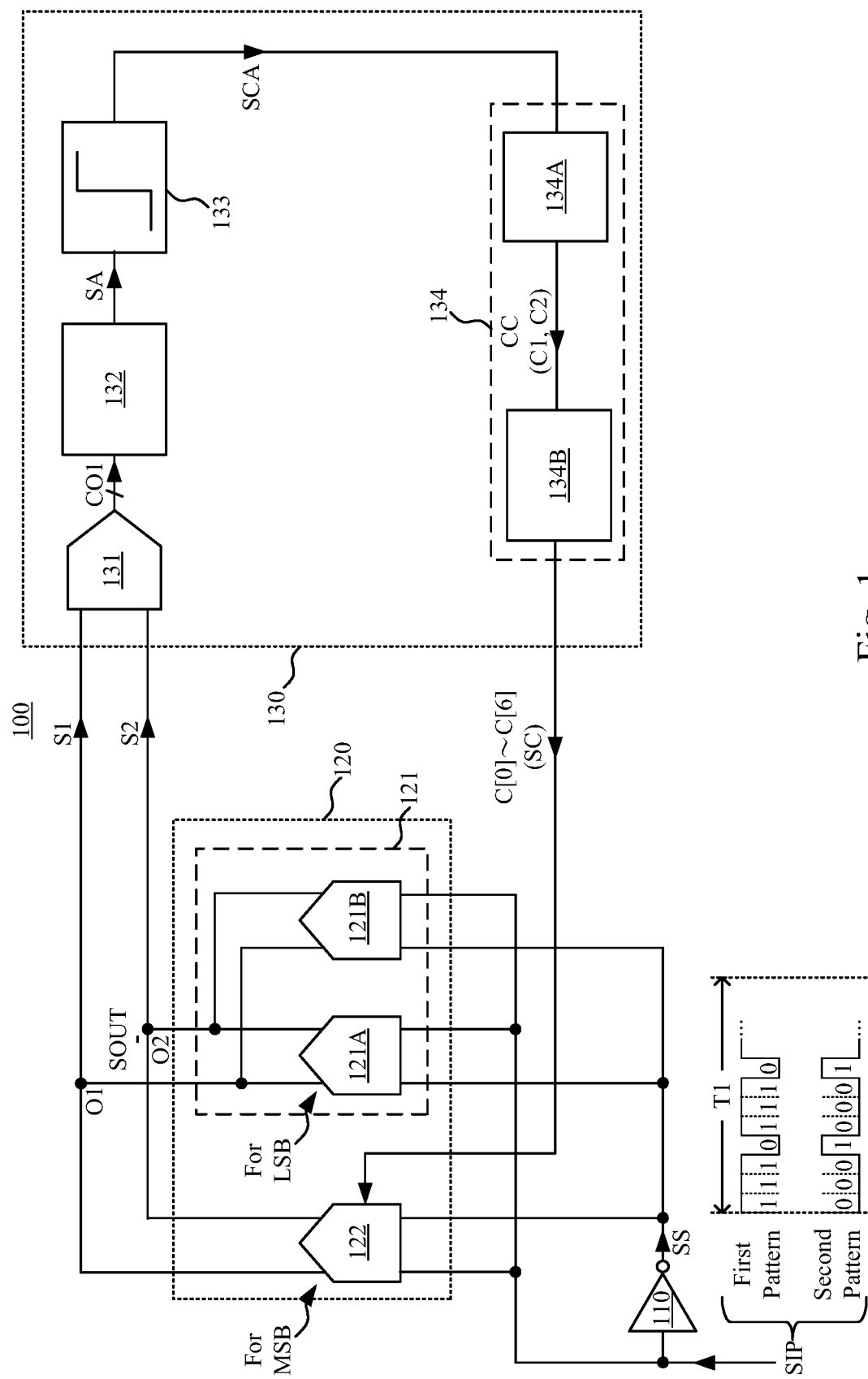
FIG. 1 is a schematic diagram of a digital-to-analog converter (DAC) device, according to some embodiments.

FIG. 1 is a schematic diagram of a digital-to-analog converter (DAC) device 100, according to some embodiments.

The DAC device 100 includes an inverter 110, a DAC circuitry 120, and a calibration circuitry 130. The inverter 110 receives an input pattern SIP, and outputs a switching signal SS. In other words, the input pattern SIP is the inverse of the switching signal SS. In some embodiments, the input pattern SIP is a testing signal for calibrating the DAC device 100. In some embodiments, in a predetermined interval T1, the input pattern SIP has at least one logic value of 1 and at least one logic value of 0, and a number of the at least one logic value of 1 is different from that of the at least one logic value of 0.

The DAC circuitry 120 includes DAC circuits 121 and 122. The DAC circuit 121 includes a DAC 121A and a DAC 121B. The DAC 121A processes N least significant bits (LSB) of digital data (not shown). The DAC 121B provides an additional current I. The DAC circuit 122 processes M most significant bits (MSB) of the digital data. The DAC circuitry 120 may generate a corresponding analog output SOUT from output terminals O1 and O2 according to the digital data.

Figure 2:
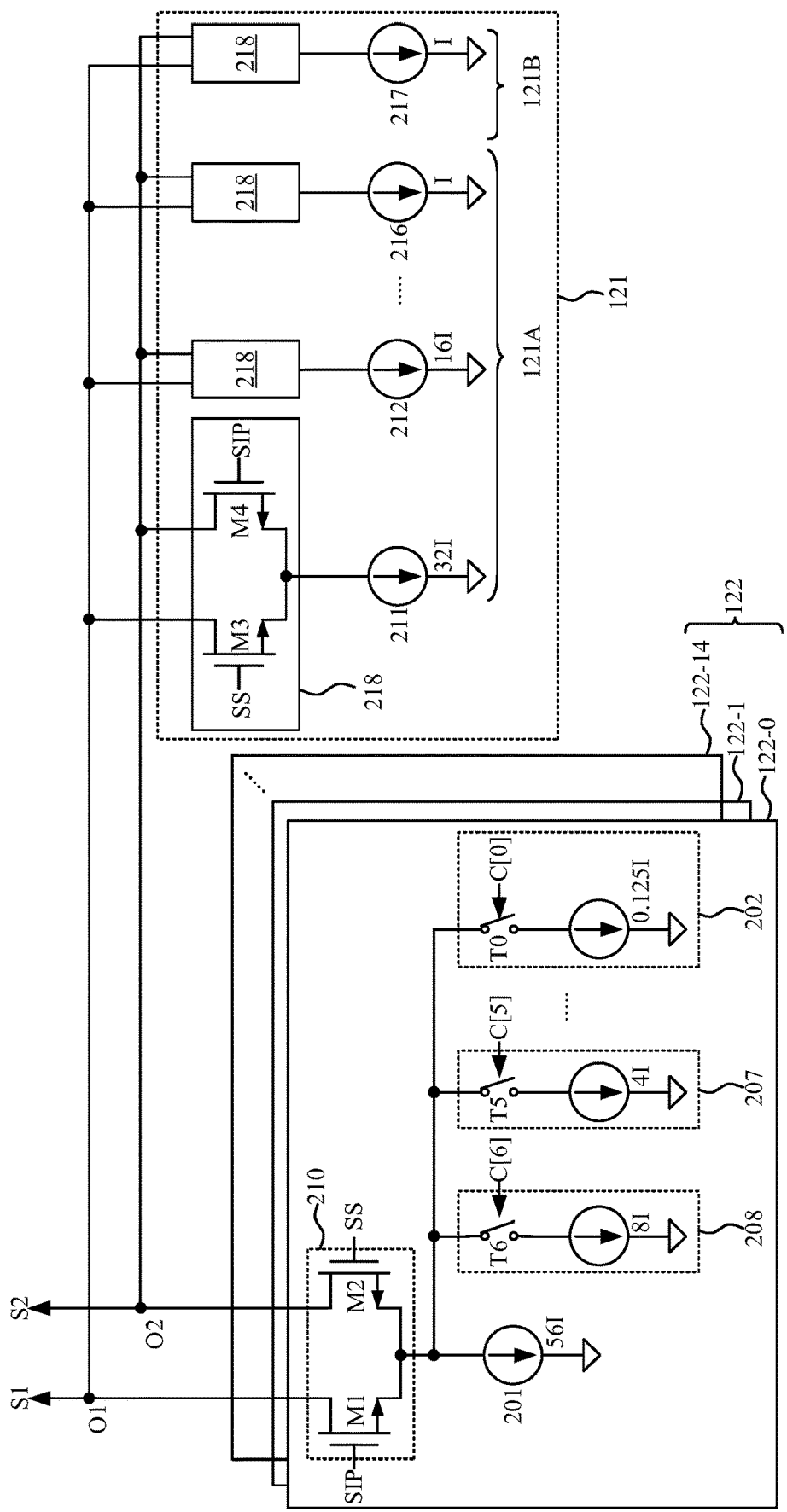
FIG. 2 is a circuit diagram of the DAC circuits in FIG. 1 according to some embodiments of the present disclosure.

The DAC circuits 121 and 122 respectively generate signals S1 and S2 to the output terminals O1 and O2 according to the input pattern SIP. For example, each of the DAC circuits 121 and 122 includes a current source circuit (as shown in FIG. 2) that provides a current. Each of the DAC circuits 121 and 122 steers different currents to the output terminal O1 or/and O2 according to the input pattern SIP. As a result, the current(s) on the output terminal O1 are summed to form the signal S1, and the current(s) on the output terminal O2 are summed to form the signal S2.

The calibration circuitry 130 is coupled to the output terminals O1 and O2, in order to receive the signals S1 and S2. In some embodiments, the calibration circuitry 130 generates an averaging signal SA according to comparison results of the signals S1 and S2, and performs a calibration operation according to the averaging signal SA, in order to generate a control signal SC for controlling DAC circuit 122.

In some embodiments, the calibration circuitry 130 includes a comparator circuit 131, an averaging circuit 132, a polarity check circuit 133, and a processing circuit 134.

Two input terminals of the comparator circuit 131 are respectively coupled to output terminals O1 and O2. The comparator circuit 131 compares the signal S1 with the signal S2 during a predetermined interval T1, in order to generate comparison signals CO1. In some embodiments, the comparator circuit 131 may be a current comparator. In some embodiments, the comparator circuit 131 may be an analog-to-digital converter. The above implementations of the comparator circuit 131 are given for illustrative purposes, and the present disclosure is not limited thereto.

The averaging circuit 132 averages the comparison signals CO1 to generate the averaging signal SA. The polarity check circuit 133 determines whether the averaging signal SA is great than zero, in order to generate a calibration signal SCA. The processing circuit 134 receives the calibration signal SCA, and performs the calibration operation according to the calibration signal SCA to generate a corresponding control code CC. In some embodiments, the polarity check circuit 133 may be implemented with a comparator circuit, and the present disclosure is not limited thereto.

In the entire testing procedure, the input pattern SIP is set to be two different patterns (e.g., first and second patterns in FIG. 1), and generate two control codes CC with the above operations. The processing circuit 134 further generates the control signal SC according to these two control codes CC. In some embodiments, one of the two different patterns is the inverse of the other.

In some embodiments, the processing circuit 134 includes a calibration circuit 134A and a control circuit 134B. The calibration circuit 134A performs the calibration operation according to the calibration signal SCA, in order to generate the corresponding control code CC. In some embodiments, the calibration operation may be a successive approximation algorithm, a binary search algorithm, etc., and the present disclosure is not limited thereto. The control circuit 134B generates the control signal SC according to the two control codes CC.

In some embodiments, the calibration circuit 134A and/or the control circuit 134B may be implemented with a digital signal processing circuit, one or more logic circuits, and/or a processing circuit that performs a finite state machine, and the present disclosure is not limited thereto.

With the configurations of the input pattern SIP and the calibration circuitry 130, in some embodiments, the control signal SC can be used for calibrating offset(s) in circuits of the DAC device 100, as well as for compensating timing error(s) and amplitude error(s) on the analog output SOUT. Detailed descriptions regarding herein are provided below with reference to FIG. 3.

FIG. 2 is a circuit diagram of the DAC circuits 121 and 122 in FIG. 1 according to some embodiments of the present disclosure. In this example, N is set as 6, M is set as 4, the LSBs are encoded as binary code, and the MSBs are encoded as thermometer code. The DAC circuit 122 includes 15 cells 122-0 to 122-14, in which the 15 cells 122-0 to 122-14 have the same circuit architecture.

Taking the cell 122-0 as an example, the cell 122-0 includes current source circuits 201-208 and a switching circuit 210. The current source circuit 201 provides a current 56I. The current source circuits 202-208 respectively provide currents $0.125I, 4I, \ldots, 8I$, and respectively include switches T0-T6, in order to be selectively turned on according to the control signal SC to adjust the current outputted from the cell 122-0. For example, the switches T0-T6 are respectively controlled by bits C[0]-C[6] of the control signal SC. When one of the switches T0-T6 is turned on, a corresponding one of the currents $8I, 4I, \ldots, 0.125I$ is transmitted to the switching circuit 210. When all of the switches T0-T6 are turned on, all of the currents $8I, 4I \ldots, 0.125I$ are transmitted to the switching circuit 210.

The switching circuit 210 steers currents of the current source circuits 201-208 to the output terminal O1 or the output terminal O2, in order to form the signal S1 or the signal S2. For example, the switching circuit 210 includes switches M1-M2. The switch M1 is coupled between the output terminal O1 and the current source circuits 201-208, and is turned on according to the input pattern SIP. The switch M2 is coupled between the output terminal O2 and the current source circuits 201-208, and is turned on according to the switching signal SS.

Furthermore, the DAC circuit 121 includes current source circuits 211-217 and switching circuits 218. The current source circuits 211-216 correspond to the DAC 121A, and respectively provide currents $32I, 16I, \ldots,$ and $I$. The current source circuit 217 corresponds to the DAC 121B and provides a current $I$. The switching circuits 218 are respectively arranged corresponding to the current source circuits 211-217, and the switching circuits 218 have the same circuit configuration.

Each of the switching circuits 218 steers a current of one corresponding of the current source circuits 211-217 to the output terminal O1 or the output terminal O2 according to the input pattern SIP, in order to form the signal S1 or the signal S2. Taking the switching circuit 218 corresponding to the current source circuit 211 as an example, the switching circuit 218 includes switches M3-M4. The switch M3 is coupled between the output terminal O1 and the current source circuit 211, and is turned on according to the switching signal SS. The switch M4 is coupled between the output terminal O2 and the current source circuit 211, and is turned on according to the input pattern SIP. When the switch M3 is turned on, the current of the current source circuit 211 is steered to the output terminal O1. Alternatively, when the switch M4 is turned on, the current of the current source circuit 211 is steered to the output terminal O2. With this analogy, configurations between the rest switching circuits 218 and the current source circuits 212-217 can be understood, and thus the repetitious descriptions are not given.

Operations of the calibration circuitry 130 are given with reference to both of FIGS. 1-2. Ideally, a current of any of the cells 122-0 to 122-14 (hereinafter referred to as "IMSB") equals to a summation of all currents of the current source circuits 211-216 (hereinafter referred to as "ILSB") and the current of the current source circuit 217 (hereinafter referred to as "IUSB"). In other words, IMSB=ILSB+IUSB.

However, due to non-ideal factors (which may include circuit offset), an error is present between IMSB and ILSB+IUSB. The calibration circuitry 130 is configured to eliminate this error.

As described above, the calibration circuitry 130 may generate the control SC, in order to calibrate the circuit offset(s) of the DAC device 100. For ease of understanding, the following operations are given with reference to an example where the cell 122-0 is calibrated, in order to illustrate operations of the calibration circuitry 130.

In some embodiments, when calibrating the cell 122-0, the rest cells 122-1 to 122-14 are all turned off. Alternatively, when calibrating the cell 122-0, currents of a half of the cells 122-1 to 122-14 are steered to the output terminal O1, and currents of another half of the cells 122-1 to 122-14 are steered to the output terminal O2. For ease of understanding, the following descriptions are given with an example where the rest cells 122-1 to 122-14 are all turned off.

As shown in FIG. 1, in a first operation, during a predetermined interval T1, the input pattern SIP is set as "1110," "1110,"... (i.e., first pattern in FIG. 1). In the first pattern, logic values of 1 account for about 75% of a number of bits, and logic values of 0 account for about 25% of the number of bits. During the predetermined interval T1, in response to this input pattern SIP, the switching signal SS is set as "0001," "0001,".... In the switching signal SS, logic values of 1 account for about 25% of the number of bits, and logic values of 0 account for about 75% of the number of bits.

In response to this input pattern SIP and switching signal SS, the switching circuits 210 and 218 are turned on during the predetermined interval T1. Accordingly, the current IMSB, the current ILSB, and the current IUSB are respectively steered to different output terminals O1 and O2, in order to from the signals S1 and S2 corresponding to the first pattern on the output terminals O1 and O2. During the predetermined interval T1, the comparator circuit 131 constantly compares the signal SI with the signal S2, in order to generate the comparison signals CO1 corresponding to the first pattern. Afterwards, with operations of the averaging circuit 132, the polarity check circuit 133, and the processing circuit 134, a corresponding control code CC (hereinafter referred to as "control code C1") is generated.

As described above, when the input pattern SIP is set as the first pattern, the logic values of 1 account for 75% of the number of bits, and the logic values of 0 account for 25% of the number of bits. Under this condition, as shown in FIG. 2, about 75% of the current of cell 122-0 is steered to the output terminal O1 via the switch M1, and about 25% of the currents of the current source circuits 211-217 are steered to the output terminal O1 via the corresponding switching circuits 218, in order to from the signal S1 corresponding to the first pattern. Similarly, about 25% of the current of cell 122-0 is steered to the output terminal O2 via the switch M2, and about 75% of the currents of the current source circuits 211-217 are steered to the output terminal O2 via the corresponding switching circuits 218, in order to from the signal S2 corresponding to the first pattern. The above relation corresponding to control code C1 in a stable state can be derived as the following equation (1):

$$0.75 \times IMSB(C1) + 0.25 \times (ILSB+IUSB) = 0.25 \times IMSB(C1) + 0.75 \times (ILSB+IUSB) + IOFFSET \rightarrow IMSB(C1) = ILSB+IUSB+2 \times IOFFSET \quad (1)$$

where IMSB(C1) indicates the current generated from the cell 122-0 according to the control code C1, and !OFFSET indicates an equivalent current offset introduced from the calibration circuitry 130 (i.e., an additional offset caused by employing the calibration circuitry 130).

In some embodiments, the control circuit 134B stores the control code C1 and performs a second operation. In the second operation, during the predetermined interval T1, the input pattern SIP is set as "0001," "0001,"... (e.g., a second pattern in FIG. 1), in which the first pattern is inverse to the second pattern. In the second pattern, the logic values of 1 account for about 25% of the number of bits, and the logic values of 0 account for about 75% of the number of bits. In response to this input pattern, the switching signal SS is set as "1110," "1110,"..., in which, in the switching signal SS, the logic values of 1 account for about 75% of the number of bits, and the logic values of 0 account for about 25% of the number of bits.

Similar to the first operation, in response to the input pattern SIP and the switching signal SS, the signals S1 and S2 corresponding to the second pattern are formed on the output terminal O1 and the output terminal O2. Then, with operations of the comparator circuit 131, the averaging circuit 132, the polarity check circuit 133, and the processing circuit 134, another corresponding control code CC (hereinafter referred to as "control code C2") is generated.

As described above, in the second pattern, the logic values of 1 accounts for about 75% of the number of bits, and the logic values of 0 accounts for about 25% of the number of bits. Under this condition, about 25% of the current of the cell 122-0 is steered to the output terminal O1 via the switch M1, and about 75% of the currents of the current source circuits 211-217 are steered to the output terminal O1 via the corresponding switching circuits 218. Similarly, about 75% of the current of the cell 122-0 is steered to the output terminal O2 via the switch M2, and about 25% of the currents of the current source circuits 211-217 are steered to the output terminal O2 via the corresponding switching circuits 218. The above relation corresponding to control code C2 in a stable state can be derived as the following equation (2):

$$0.25 \times IMSB(C2) + 0.75 \times (ILSB+IUSB) = 0.75 \times IMSB(C2) + 0.25 \times (ILSB+IUSB) + IOFFSET \rightarrow ILSB+IUSB = IMSB(C2) + 2 \times IOFFSET \quad (2)$$

where IMSB(C2) indicates the current generated from the cell 122-0 according to the control code C2.

Accordingly, the control circuit 134B may subtract equation (2) from equation (1), in order to derive the following equation (3), in which ILSB and IUSB are target current values after being calibrated. As a result, the control circuit 134B averages the control code C1 and the control code C2, in order to generate the control signal SC.

$$[IMSB(C1) + IMSB(C2)]/2 = ILSB + IUSB \quad (3)$$

$$\rightarrow SC = (C1+C2)/2$$

According to equation (3), the current that is generated from the cell 122-0 in response to the control signal SC may be derived as the following equation:

$$IMSB(SC) = IMSB[(C1+C2)/2]$$
$$= [IMSB(C1) + IMSB(C2)]/2$$
$$= ILSB + IUSB$$

From the above equation, it can be understood that impacts, from the equivalent input current offset caused by the calibration circuitry 130, on the cell 122-0 can be eliminated, and thus the control SC generated from the calibration circuitry 130 is able to achieve IMSB=ILSB+IUSB. With this analogy, by performing the same operations repeatedly, corresponding control signals SC corresponding to the rest cells 122-1 to 122-14 can be generated.

The above circuit configurations are given for illustrative purposes, and the present disclosure is not limited thereto. For example, in some embodiments, the DAC device 100 may further include a resistive load (not shown). The resistive load is coupled to the output terminals O1 and O2, in order to convert the analog output SOUT into a voltage signal. In this example, the comparator circuit 131 may be implemented with a voltage comparator circuit.

The configurations of the first and the second patterns in FIG. 1 are given for illustrative purposes, and the present disclosure is not limited thereto. Various input patterns that have different numbers of logic values 1 and 0 are within the contemplated scope of the present disclosure.

Figure 3:
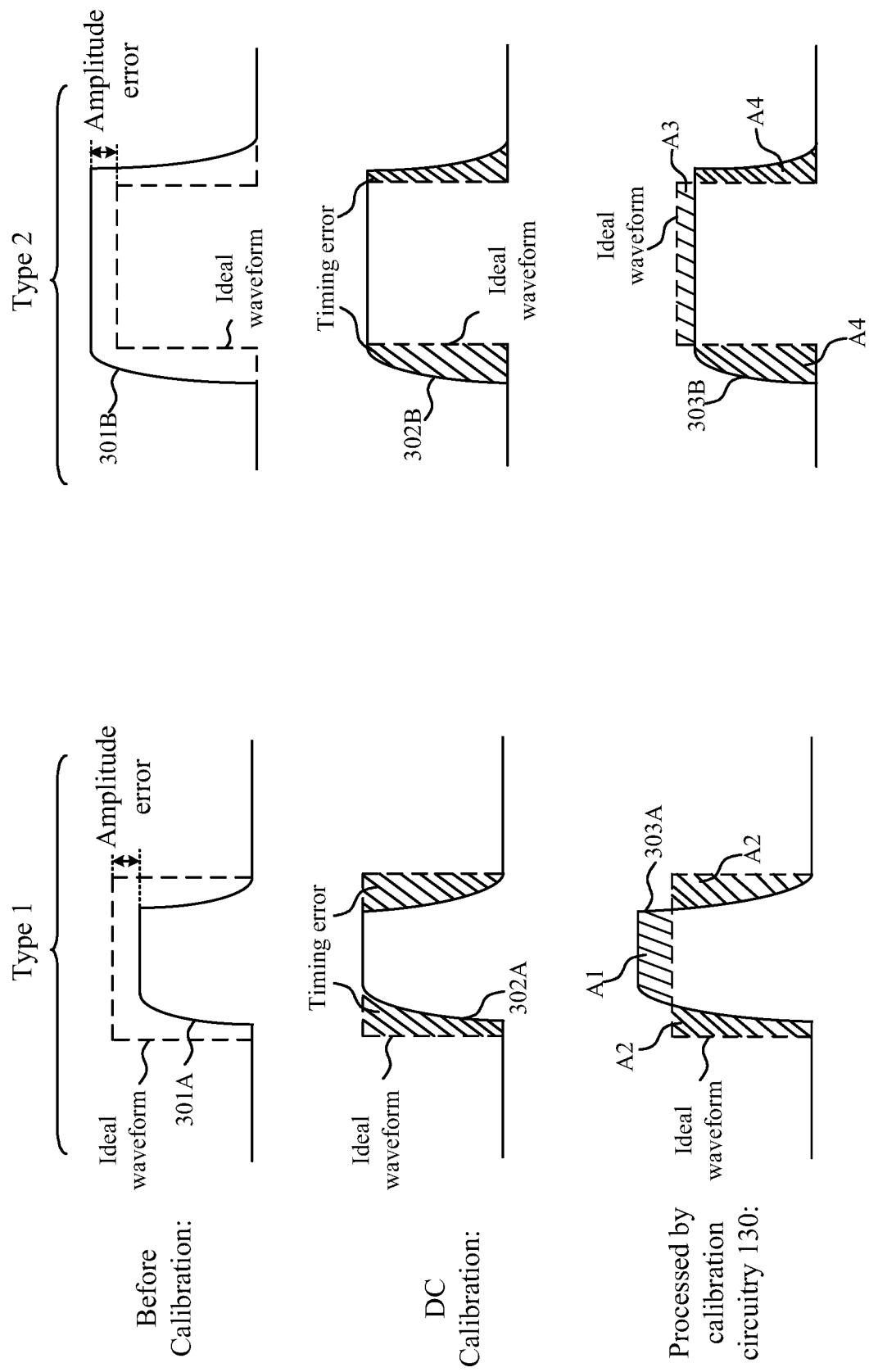
FIG. 3 is a schematic diagram illustrating a waveform of the analog output in FIG. 1 and that of an analog output of related approaches, according to some embodiments of the present disclosure.

FIG. 3 is a schematic diagram illustrating a waveform of the analog output SOUT in FIG. 1 and that of an analog output of related approaches, according to some embodiments of the present disclosure. Before being calibrated, as shown by a waveform 301A or 301B, an amplitude error and a timing error are present between the analog output SOUT and an ideal waveform. In some related approaches, a technique of DC calibration is employed to calibrate a DAC circuit. In these approaches, a DC signal is directly inputted to an input terminal of the DAC circuit for calibration. Under this condition, an output terminal (e.g., output terminal O1 or O2) of the DAC circuit also outputs a DC signal. As shown by a waveform 302A or 302B, in these approaches, although the amplitude error between the analog output SOUT and the ideal waveform can be eliminated, the timing error still exists. In addition, in the above approaches, if the output terminal is coupled to an inductive load (e.g., transformer), an additional switch is required to cut off a connection between the output terminal and the inductive load, in order to generate the DC signal for calibration, resulting in unnecessary waste of circuit area and higher parasitic capacitor.

Compared with the above approaches, in some embodiments, by inputting toggle signals (e.g., input pattern SIP) to the DAC device 100, various errors in different timings can be eliminated. For example, as shown by a waveform 303A or 303B, the amplitude error and the timing error between the analog output SOUT and the ideal waveform are eliminated. A total current amount of the analog output SOUT corresponding to the waveform 303A is the same as a total current amount of the ideal waveform, in which an area A1 is a sum of two areas A2. Alternatively, a total current amount of the analog output SOUT corresponding to the waveform 303B is the same as the total current amount of the ideal waveform. In other words, an area A3 is the same as a sum of two areas A4, in which the two areas A4 substantially equal to an amount of the timing error. Moreover, compared with the technique of DC calibration, the output of the DAC device 100 is a toggle signal in some embodiments. Accordingly, the DAC device 100 may be coupled to the inductive load without using additional switch.

Figure 4:
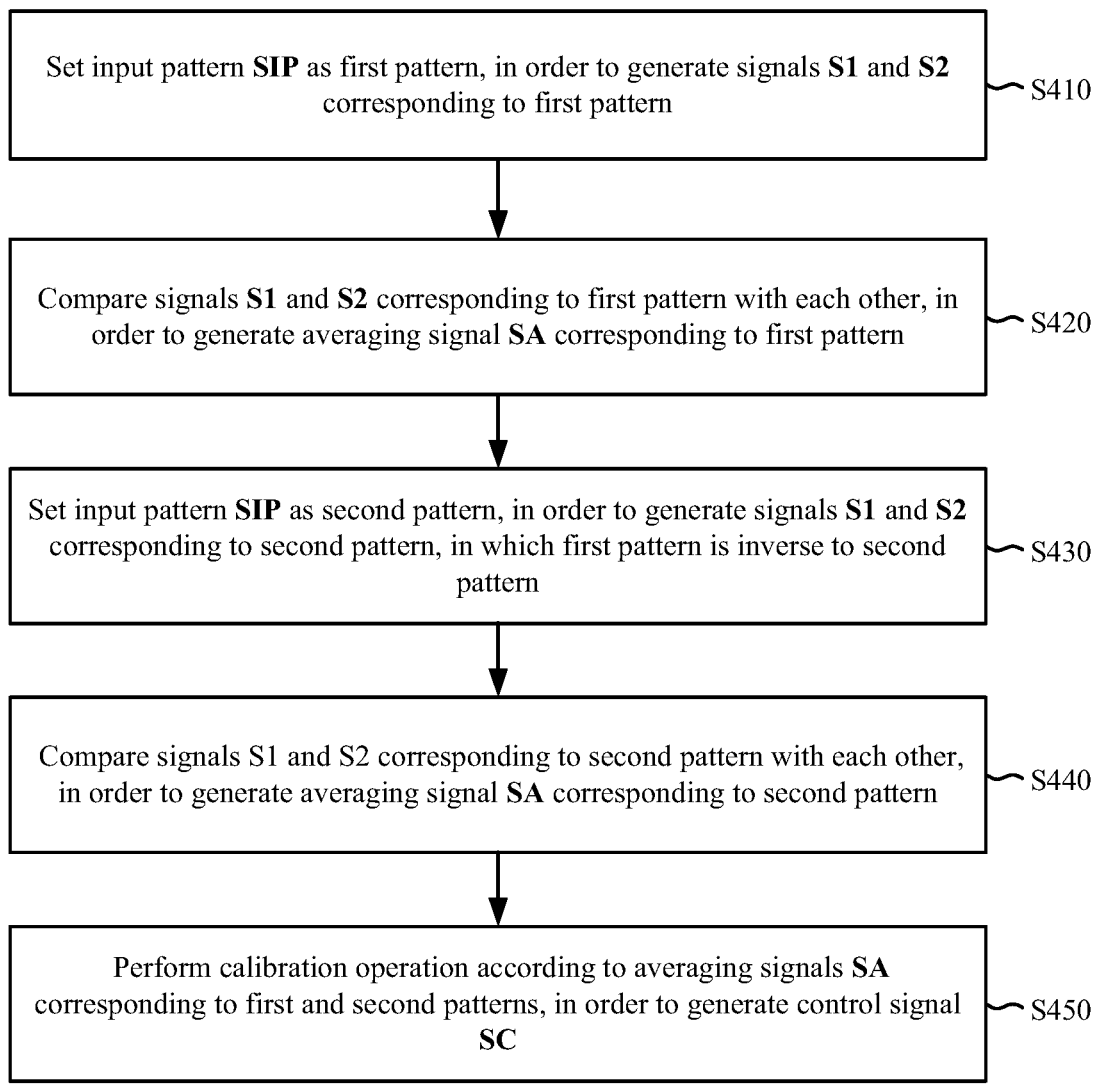
FIG. 4 is a flow chart of a calibration method according to some embodiments of the present disclosure.

FIG. 4 is a flow chart of a calibration method 400 according to some embodiments of the present disclosure. For ease of understanding, operations of the calibration method 400 are described with reference to each figure.

In operation S410, the input pattern SIP is set as the first pattern, in order to generate the signals S1 and S2 corresponding to the first pattern.

In operation S420, the signals S1 and S2 corresponding to the first pattern are compared with each other, in order to generate the averaging signal SA corresponding to the first pattern.

In operation S430, the input pattern SIP is set as the second pattern, in order to generate the signals S1 and S2 corresponding to the second pattern, in which the first pattern is inverse to the second pattern.

In operation S440, the signals S1 and S2 corresponding to the second pattern are compared with each other, in order to generate the averaging signal SA corresponding to the second pattern.

In operations S450, the calibration operation is performed according to the averaging signals SA corresponding to the first and second patterns, in order to generate the control signal SC.

The above operations can be understood with reference to FIGS. 1-3, and thus the repetitious descriptions are not further given. The above description of the calibration method 400 includes exemplary operations, but the operations of the calibration method 400 are not necessarily performed in the order described above. The order of the operations of the calibration method 400 can be changed, or the operations can be executed simultaneously or partially simultaneously as appropriate, in accordance with the spirit and scope of various embodiments of the present disclosure.

As described above, the DAC device and the calibration method provided in embodiments of the present disclosure are able to calibrate the circuit offsets of the DAC device by using input patterns that are DC imbalanced e.g., the number of logic values of 1 is different from the number of logic values of 0) and the averaging operation. As a result, the impacts of amplitude errors and timing errors can be reduced.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A digital-to-analog converter (DAC) device, comprising:
 a DAC circuitry comprising:
  a first DAC circuit; and
  a second DAC circuit,
  wherein the first DAC circuit and the second DAC circuit are configured to generate a first signal and a second signal according to an input pattern, the input pattern comprises at least one first logic value and at least one second logic value, and a number of the at least one first logic value is different from a number of the at least one second logic value; and
 a calibration circuitry configured to perform a calibration operation according to a plurality of first comparison results and a plurality of second comparison results, in order to generate a control signal for controlling the second DAC circuit, wherein the plurality of first comparison results are results of comparing the first signal with the second signal when the input pattern is a first pattern, the plurality of second comparison results are results of comparing the first signal with the second signal when the input pattern is a second pattern, and the first pattern is inverse to the second pattern.

2. The DAC device of claim 1, wherein the calibration circuitry comprises:
a comparator circuit configured to compare the first signal with the second signal to generate a plurality of comparison signals;
an averaging circuit configured to average the plurality of comparison signals, in order to generate an averaging signal;
a polarity check circuit configured to determine whether the averaging signal is greater than zero, in order to generate a calibration signal; and
a processing circuit configured to perform the calibration operation when the input pattern is the first pattern in order to generate a first control code, and to perform the calibration operation when the input pattern is the second pattern in order to generate a second control code, in order to generate the control signal according to the first control code and the second control code.

3. The DAC device of claim 2, wherein the processing circuit is further configured to average the first control code and the second control code, in order to generate the control signal.

4. The DAC device of claim 1, wherein the first DAC circuit is configured to process at least one least significant bit of digital data, and the second DAC circuit is configured to process at least one most significant bit of the digital data.

5. The DAC device of claim 1, wherein the first DAC circuit comprises a current source circuit, and the first DAC circuit is configured to steer a current of the current source circuit to different output terminals of the DAC circuitry according to the input pattern, in order to generate the first signal and the second signal.

6. The DAC device of claim 1, wherein the second DAC circuit comprises a current source circuit, and the second DAC circuit is configured to steer a current of the current source circuit to different output terminals of the DAC circuitry according to the input pattern, in order to generate the first signal and the second signal.

7. The DAC device of claim 1, wherein the second DAC circuit comprises:
a plurality of current source circuits, wherein a portion of the plurality of current source circuits is selectively turned on according to the control signal; and
a switching circuit configured to steer currents of the plurality of current source circuits to a first output terminal and a second output terminal according to the input pattern, in order to generate the first signal and the second signal.

8. The DAC device of claim 7, further comprising:
an inverter configured to generate a switching signal according to the input pattern, wherein the switching circuit comprises:
a first switch coupled between the first output terminal and the plurality of current source circuits, and is selectively turned on according to the input pattern; and
a second switch coupled between the second output terminal and the plurality of current source circuits, and is selectively turned on according to the switching signal.

9. The DAC device of claim 1, wherein the first DAC circuit comprises:
a plurality of current source circuits configured to provide a plurality of currents; and
a plurality of switching circuits arranged respectively corresponding to the plurality of current source circuits, the plurality of switching circuits configured to steer the plurality of currents to a first output terminal and a second output terminal according to the input pattern, in order to generate the first signal and the second signal.

10. The DAC device of claim 9, further comprising:
an inverter configured to generate a switching signal according to the input pattern, wherein each of the plurality of switching circuit comprises:
a first switch coupled between the first output terminal and a corresponding one current source circuit of the plurality of current source circuits, and is selectively turned on according to the input pattern; and
a second switch coupled between the second output terminal and the corresponding one current source circuit, and is selectively turned on according to the switching signal.

11. A calibration method, comprising:
generating, by a first digital-to-analog converter (DAC) circuit and a second DAC circuit, a first signal and a second signal according to an input pattern, wherein the input pattern comprises at least one first logic value and at least one second logic value, and a number of the at least one first logic value is different from a number of the at least one second logic value; and
performing a calibration operation according to a plurality of first comparison results and a plurality of second comparison results, in order to generate a control signal for controlling the second DAC circuit,
wherein the plurality of first comparison results are results of comparing the first signal with the second signal when the input pattern is a first pattern, the plurality of second comparison results are results of comparing the first signal with the second signal when the input pattern is a second pattern, and the first pattern is inverse to the second pattern.

12. The calibration method of claim 11, wherein performing the calibration operation according to the plurality of first comparison results and the plurality of second comparison results comprises:
comparing the first signal with the second signal to generate a plurality of comparison signals; and
averaging the plurality of comparison signals, in order to generate an averaging signal.

13. The calibration method of claim 12, wherein performing the calibration operation according to the plurality of first comparison results and the plurality of second comparison results further comprises:
determining whether the averaging signal is greater than zero, in order to generate a calibration signal;
performing the calibration operation when the input pattern is the first pattern, in order to generate a first control code;
performing the calibration operation when the input pattern is the second pattern, in order to generate a second control code; and generating the control signal according to the first control code and the second control code.

14. The calibration method of claim 13, wherein generating the control signal comprises:
averaging the first control code and the second control code to generate the control signal.

15. The calibration method of claim 11, wherein the first DAC circuit is configured to process at least one least significant bit of digital data, and the second DAC circuit is configured to process at least one most significant bit of the digital data.

16. The calibration method of claim 11, wherein the first DAC circuit comprises a current source circuit, and the first DAC circuit is configured to steer a current of the current source circuit to different output terminals of the first DAC circuit according to the input pattern, in order to generate the first signal and the second signal.

17. The calibration method of claim 11, wherein the second DAC circuit comprises a current source circuit, and the second DAC circuit is configured to steer a current of the current source circuit to different output terminals of the second DAC circuit according to the input pattern, in order to generate the first signal and the second signal.

18. The calibration method of claim 11, wherein generating, by the first DAC circuit and the second DAC circuit, the first signal and the second signal according to the input pattern comprises:
selectively turning on a portion of a plurality of current source circuits of the second DAC circuit according to the control signal; and
steering, by a switching circuit, currents of the plurality of current source circuits to a first output terminal and a second output terminal according to the input pattern, in order to generate the first signal and the second signal.

19. The calibration method claim 18, wherein steering, by the switching circuit, the currents of the plurality of current source circuits to the first output terminal and the second output terminal according to the input pattern comprises:
generating, by an inverter, a switching signal according to the input pattern;
selectively turning on a first switch of the switching circuit, wherein the first switch is coupled between the first output terminal and the plurality of current source circuits; and
selectively turning on a second switch of the switching circuit, wherein the second switch is coupled between the second output terminal and the plurality of current source circuits.

20. The calibration method of claim 11, wherein generating, by the first DAC circuit and the second DAC circuit, the first signal and the second signal according to an input pattern comprises:
providing, by a plurality of current source circuits, a plurality of currents; and
steering, by a plurality of switching circuits, the plurality of currents to a first output terminal and a second output terminal according to the input pattern, in order to generate the first signal and the second signal, wherein the plurality of switching circuits are arranged respectively corresponding to the plurality of current source circuits.

* * * * *